US012666531B2

(12) United States Patent
Jeglitsch et al.

(10) Patent No.: US 12,666,531 B2
(45) Date of Patent: Jun. 23, 2026

(54) COMPONENT CARRIER WITH FLEXIBLE PORTIONS AND MANUFACTURING METHOD

(71) Applicant: AT&S Austria Technologie & Systemtechnik AG, Leoben (AT)

(72) Inventors: Dieter Jeglitsch, Bruck/Mur (AT); Gerald Weis, Bruck/Mur (AT); Bronson Stolte, Howell, MI (US)

(73) Assignee: AT&S Austria Technologie & Systemtechnik Aktiengsellschaft, Leoben (AT)

( * ) Notice: Subject to any disclaimer, the term of this patent is extended or adjusted under 35 U.S.C. 154(b) by 166 days.

(21) Appl. No.: 18/444,902

(22) Filed: Feb. 19, 2024

(65) Prior Publication Data

US 2025/0267786 A1     Aug. 21, 2025

(51) Int. Cl.
| | |
|---|---|
| *H05K 1/02* | (2006.01) |
| *H05K 3/46* | (2006.01) |
| *H10W 70/05* | (2026.01) |
| *H10W 70/67* | (2026.01) |
| *H05K 1/181* | (2026.01) |
| *H05K 1/185* | (2026.01) |

(52) U.S. Cl.
CPC ......... *H05K 1/0278* (2013.01); *H05K 3/4691* (2013.01); *H10W 70/05* (2026.01); *H10W 70/688* (2026.01); *H05K 1/181* (2013.01); *H05K 1/185* (2013.01)

(58) Field of Classification Search
CPC .... H05K 1/0278; H05K 3/4691; H05K 1/181; H05K 1/185; H01L 21/4857; H01L 23/4985
USPC ......................................... 361/749, 784, 789
See application file for complete search history.

(56) References Cited

U.S. PATENT DOCUMENTS

| | | | |
|---|---|---|---|
| 6,705,005 B1 | 3/2004 | Blazier et al. | |
| 6,927,344 B1 | 8/2005 | Gall et al. | |
| 7,992,290 B2 | 8/2011 | Chen et al. | |
| 2008/0005896 A1 | 1/2008 | Yeh et al. | |
| 2020/0178401 A1* | 6/2020 | Min | H01Q 21/28 |
| 2023/0055647 A1* | 2/2023 | Kani | H05K 3/3426 |

FOREIGN PATENT DOCUMENTS

JP          S58103182 U          7/1983

* cited by examiner

*Primary Examiner* — Binh B Tran
(74) *Attorney, Agent, or Firm* — Robert A. Blaha; Smith Tempel Blaha LLC

(57) ABSTRACT

A component carrier having a stack with at least one electrically insulating layer structure and/or at least one electrically conductive layer structure, wherein the stack includes: i) a central rigid portion; ii) a first flexible portion, extending from a first side of the central rigid portion; and iii) a second flexible portion, extending from a second side of the central rigid portion. The first flexible portion extends from a first vertical level from the central rigid portion that is different from a second vertical level from which the second flexible portion extends from said central rigid portion.

18 Claims, 4 Drawing Sheets

COMPONENT CARRIER WITH FLEXIBLE PORTIONS AND MANUFACTURING METHOD

TECHNICAL FIELD

Embodiments of the disclosure relate to the technical field of component carriers, such as printed circuit boards or IC substrates, and their manufacture.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. Also, an efficient protection against electromagnetic interference (EMI) is becoming an increasing issue. At the same time, component carriers shall be mechanically robust and electrically and magnetically reliable to be operable even under harsh conditions.

In this context, it may still be considered a challenge to provide a component carrier with a high design flexibility, in particular regarding the implementation of functionalities. For example, a bendable component carrier may be especially suitable for installation and/or service purposes. Such a bending may be implemented by a deformation of an at least partially flexible component carrier. However, the production of (semi-) flexible component carriers may lead to higher material costs.

SUMMARY

There may be a need to provide a component carrier with a high functionality and flexibility.

A component carrier and a manufacturing method are described.

According to a first aspect of the disclosure, there is described a component carrier having a (multi-layer) stack comprising at least one electrically insulating layer structure (e.g., a resin) and/or at least one electrically conductive layer structure (e.g., copper traces), wherein the stack comprises: i) a central rigid portion; ii) a first flexible portion, extending from a first (lateral) side of the central rigid portion; and iii) a second flexible portion, extending from a second (lateral) side of the central rigid portion.

In particular, the first flexible portion extends from a first vertical level (the position along the thickness direction of the stack) from the central rigid portion that is different from a second vertical level from which the second flexible portion extends from said central rigid portion.

According to a second aspect of the disclosure, there is described a method of manufacturing a component carrier, the method comprising: i) providing a stack comprising at least one electrically insulating layer structure and/or at least one electrically conductive layer structure, and a central rigid portion; (wherein forming the stack further comprises) ii) forming a first flexible portion, extending from a first side of the central rigid portion; and iii) forming a second flexible portion, extending from a second side of the central rigid portion.

The first flexible portion extends from a first vertical level from the central rigid portion that is different from a second vertical level from which the second flexible portion extends from said central rigid portion.

Overview of Embodiments

In the present context, the term "component carrier" may refer to a final component carrier product as well as to a component carrier preform (i.e., a component carrier in production, in other words a semi-finished product). In an example, a component carrier preform may be a panel that comprises a plurality of semi-finished component carriers that are manufactured together. At a final stage, the panel may be separated into the plurality of final component carrier products.

In an embodiment, the component carrier "stack" comprises at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components. In an example, the stack may be nevertheless very thin and compact. In another example, the stack may be very thick for a high-density product. The stacking direction (height/thickness) may be arranged in the vertical direction z. Further, the stacking direction may be perpendicular to the two directions of main extension (along x and y) of the (plate-shaped) component carrier.

In an example, all layers of the component carrier may form the stack. In another example, only a part of the layers of the component carrier form the stack. In this context, the term "layer structure" may in particular refer to a continuous or discontinuous layer (or separated islands within the same plane) of electrically conductive or electrically insulating material. A plurality of such layers, parallel stacked one upon the other, may form the stack in the vertical direction.

In the present context, the term "electrically conductive layer structure" may refer to an electrically conductive structure (e.g., a metal, in particular copper, more in particular for of a copper foil, or carbon, in particular graphene, e.g., as a layer) which has been patterned, e.g., by a subtractive method such as (wet or plasma) etching and/or by an additive method such as SAP or mSAP. After patterning, the electrically conductive structure may for example comprise a plurality of electrically conductive (metal, e.g., copper) traces and/or pads and/or interconnections, and/or conductive paths/areas. In this manner, electrical connection within the component carrier can be provided.

In the present context, the term "portion" may refer to a part/region of the component carrier (or stack) with a specific property. In particular, said property may refer to bendability, for example rigid and flexible (in particular semi-flexible or fully flexible). In an embodiment, the bendability may be seen as a relative term, so that a rigid portion is significantly less bendable than a flexible portion. In an embodiment, a rigid portion comprises a higher number of layers than a flexible portion. In an embodiment, a rigid portion comprises a less flexible material than a flexible portion. In an example, a flexible portion may be flexible due to a low thickness and/or due to a flexible material, e.g., polyimide. In a preferred example, a flexible portion may interconnect two rigid portions in a flexible manner, so that the rigid portions may be bent towards each other by means of the flexible portion in between.

According to an exemplary embodiment, the disclosure may be based on the idea that a component carrier with a high level of functionality and flexibility may be provided, when the component carrier comprises a central rigid portion and two flexible portions which extend from respective sides of the central rigid portion. The flexible portions may hereby extend from different vertical heights (along the stack thickness direction) of the central rigid portion, thereby enabling different bending behaviors, when compared to each other. In further embodiments, the component carrier may comprise more than two flexible portions.

For example, a first flexible portion may be bent to the top main surface of the central rigid portion, while a second flexible portion may be bent to the bottom main surface of the central rigid portion. In other words, the described component carrier may enable a folding with positive and negative angles.

In another example, a flexible first portion may be bent to a first spatial direction, while a second flexible portion may be bent to a second spatial direction, wherein the first spatial direction and the second spatial direction are different. This may include bending the first flexible portion and the second flexible portion in opposite directions. Alternatively, the first flexible portion may be bent in stack thickness direction (z), whereas the second flexible portion may be bent in stack main extension direction (x or y). In a further example, at least one of the first flexible portion or the second flexible portion may be (axially) twisted (additionally to the previously described bending functionality).

Such an architecture may enable a large variety of applications and may be extremely design-flexible regarding a plurality of applications. Depending on functional and/or spatial requirements, specific bending geometries may be advantageous. The component carrier may be provided with (electronic) components that may be bent to specific locations. Further, a desired bending mode may be fixed, e.g., by an encapsulant. A specific advantage may be seen in an improved utilization of installation space.

The described component carrier may be manufactured in a cost-efficient and straightforward manner within the component carrier manufacture using established technology. For example, holes/trenches may be drilled in a stack to provide a (thin) flexible portion next to a (thick) rigid portion. The described component carrier may be manufactured with low cost/effort disclosure and may be bent, e.g., for installation/service purposes.

In an embodiment, the central rigid portion comprises at least two opposed main surfaces (e.g., top and bottom main surfaces), wherein the first flexible portion extends to a first of said main surfaces, and wherein the second flexible portion extends to a second of said main surfaces. In this context, the term "main surface" may refer to a plane being oriented perpendicular to the stacking direction (thickness) of the stack. This may provide the advantage that a high degree of functionality and design flexibility can be provided. Depending on functional and/or spatial requirements, each flexible portion may be bent towards a respective main surface.

In an embodiment, the first flexible portion and the second flexible portion are opposed to each other with respect to the central rigid portion, in particular in a (horizontal) direction (X, Y) being perpendicular to the (vertical) stacking direction (Z). This may provide the advantage that the flexible portions can directly extend from (lateral) sidewalls of the central rigid portion, thereby increasing stability and making manufacture easier. In a preferred example, the flexible portions may be formed as stack layers that extend from the central rigid portion of the stack. In this manner, the flexible portions may be manufactured in a straightforward manner by drilling holes into the stack.

In an embodiment, the first flexible portion and the second flexible portion are bendable in the same or different (in particular opposite) directions. In an example, the first flexible portion and the second flexible portion are differently bendable in the opposed directions. For example, the first flexible portion and the second flexible portion are bendable with different angles, in particular angles with different mathematical sign (+, −). In an example, the first flexible portion and the second flexible portion are (fully) bendable in the opposite direction. Thereby, a plurality of different architectures may be provided in an easy and straightforward manner.

In a specific example, a semi-flex board/component carrier may be bent a maximum of ten times. Semi-flex boards are generally made of standard electrically insulating material, for example prepreg, but rather thin to make it flexible. The thin thickness enables bending a few times, for example during installation of the component carrier and connection to other parts. Bending more often could/would disrupt the electrical traces. However, a flex-board may use special material, e.g., polyimide and/or polyethylene terephthalate. This may provide infinite bending ability without breaking electrically conductive traces/connection surrounding and/ or in contact with the flex material.

In an embodiment, the first flexible portion is arranged at a bottom or top part, in particular the bottom or top layer, of the stack. In an embodiment, the second flexible portion is arranged at a top or bottom part, in particular the top or bottom layer, of the stack. In this manner, the different vertical heights and the bending in same/different directions may be realized in an efficient and robust manner. Further, a straightforward implementation may be enabled by forming the flexible portions from top/bottom layers of the stack. Hereby, one flexible portion is applied on one side, while the other flexible portion is applied on the opposed side of the stack. In an embodiment, the flexible portions are arranged at the outside of the bending region (longer than at the inside). This may provide the advantage that reliability is ensured since a crack/break is avoided.

In an embodiment, a first opening opens to the top/bottom of the stack and at least partially delimits (defines) the first flexible portion. In an embodiment, a second opening opens to the bottom/top of the stack and at least partially delimits (defines) the second flexible portion which opens to the bottom of the stack. In an embodiment, the openings open in same/different (opposite) directions (Z+, Z−). This may provide the advantage that the flexible portions can be provided by forming openings in the stack. In order to form the openings, established component carrier manufacturing techniques such as mechanical drilling, laser drilling, etching, or routing may be directly applied, thereby saving efforts.

In an example, the respective flexible portion is delimited by two opposed openings (preferably having different vertical levels/heights). In this example, not only one opening is formed to define a flexible portion, but at least two openings, each formed from an opposite (main surface) side of the stack. In this manner, the flexible portions may be provided in an especially design-flexible manner at different vertical heights of the stack, e.g., both close to the center of the stack (in the stacking direction).

In an embodiment, the component carrier further comprises a first rigid portion, in particular forming part of the stack, extending from the first flexible portion. In an example, the component carrier further comprises a second rigid portion, in particular forming part of the stack, extending from the second flexible portion. This may provide the advantage that further rigid portions can be moved (bent) with respect to the central rigid portion in an efficient, robust, and design-flexible manner. The rigid portions may comprise a plurality of different functionalities, for example realized by at least partially embedded (e.g., 2.5D technology) or surface-mounted components. In order to achieve specific requirements regarding technical functionality or space, a large variety of bending position may be realized.

In an embodiment, the component carrier is configured so that the first rigid portion is bendable, by (means of) the first flexible portion, with respect to (towards) the first main surface of the central rigid portion. In an example, the component carrier is configured so that the second rigid portion is bendable, by (means of) the second flexible portion, with respect to (towards) the second main surface of the central rigid portion. In an example, the flexible portions may be bent such that the first/second rigid portions are (essentially) parallel to the central rigid portion. In another example, the flexible portions may be bent such that the first/second rigid portions are (essentially) perpendicular to the central rigid portion. In an embodiment, the first/second rigid portions are twisted by the flexible portions and/or perpendicular with respect to the central rigid portion. Depending on the requirements such as available space, desired functionality, or degree of protection, a suitable configuration may be chosen.

In an embodiment, the central rigid portion and/or the first rigid portion and/or the second rigid portion and/or the first flexible portion and/or the second flexible portion is configured to reach a bending angle of the first flexible portion and/or the second flexible portion with respect to the respective central rigid portion and/or the first rigid portion and/or the second rigid portion of at least 45°, in particular at least 90°, more in particular at least 120°, more in particular at least 180°. Based on the (degree of bendability of the) flexible portions, a plurality of designs is possible, e.g., a Z-shape (see FIG. 1) or an S-shape (see FIG. 2). In an example, the (reachable) angle values may not affect the function(s), i.e., operation, of the component carrier.

In an embodiment, the bending radius may be bigger than 1 mm, in particular bigger than 5 mm. Alternatively, the bending radius may be larger than 500 µm. For semi-flex applications the radius may play a role because in case of low radius, it might lead to cracks.

In an embodiment, the central rigid portion and/or the first rigid portion and/or the second rigid portion and/or the first flexible portion and/or the second flexible portion is configured to bend the first flexible portion and the second flexible portion towards opposed directions. This new approach may enable especially efficient architectures.

In an embodiment, the stack comprises a first layer structure that extends from the central rigid portion (continuously) to the first flexible portion. In an embodiment, the stack comprises a second layer structure that extends from the central rigid portion (continuously) to the second flexible portion. Thereby, a stable and cost-efficient manufacturing process may be enabled. One or more layer structures of the stack may extend beyond the central rigid portion, thereby forming a flexible portion. The flexibility in this case may be based on the low thickness of one or more layers of the flexible portion in comparison to the layer stack of the central rigid portion. Since the flexible portion is in this example inherently connected to the stack (monolithically formed instead of attached), a high degree of stability may be provided.

In an embodiment, the central rigid portion comprises a (e.g., an electronic) component. In an embodiment, at least one component is (at least partially) embedded (in a cavity) and/or fully embedded and/or encapsulated and/or surface mounted. Components are well established in component carrier technology and may enable a plurality of different functionalities.

In an embodiment, the component comprises a further layer structure, for example, the central rigid portion comprises two or more layers with a Z-interconnection.

In an embodiment, the first rigid portion and/or the second rigid portion comprises a further component. In an embodiment, at least one further (e.g., a second) component is (at least partially) embedded (in a cavity) and/or fully embedded and/or encapsulated and/or surface mounted. By means of the flexible portions, components on/in the first/second rigid portion may be moved to a desired spatial position in an efficient and stable manner.

In an embodiment, the central rigid portion and/or the first rigid portion and/or the second rigid portion and/or the first flexible portion and/or the second flexible portion is configured so that bending of the first flexible portion and/or the second flexible portion enables a coupling between the component and the further component. In an example, at least two components are brought into spatial proximity by the bending, thereby enabling a specific advantageous interaction/coupling, e.g., a wireless exchange of information.

In an embodiment, the central rigid portion and the first flexible portion (in particular also the first rigid portion) are embedded in a common encapsulant/mold. In an embodiment, the central rigid portion and the second flexible portion (in particular, also the second rigid portion) are embedded in a further common encapsulant. This may provide the advantage of protecting delicate parts of the component carriers, e.g., electronic components. Further, this may provide the advantage of fixing a specific bending configuration, e.g., a bending angle of 180° as shown in FIG. 3. Depending on the desired results, the whole stack (with at least two flexible portions) may be encapsulated. In an example, the encapsulant may be an organic material, e.g., a resin material (in particular for semi-flex applications). In the case of full-flex applications, polyimide may be used.

In an embodiment, only one of the first/second rigid/flexible portion is encapsulated with the central rigid portion, while the other rigid/flexible portion remains movable/bendable. Thereby, a compromise between stability/protection and flexible operation may be provided.

In an embodiment, the central rigid portion is configured as a multilayer board Z-interconnect (zic). For example, the multilayer board may comprise two or more boards connected in Z-direction. In an example, the central rigid portion may be configured as an antenna.

In an embodiment, the first flexible portion and/or the second flexible portion comprises at least one flexible layer structure, in particular a resin layer and/or a metal layer. Such a layer structure may enable the desired bending efficiently. In an example, the flexible portion may be flexible due to a very low layer thickness (in comparison to the rigid portion). In another example, the flexible portion may comprise or consist of a flexible material, for example polyimide.

In an embodiment, the flexible layer structure comprises a flexible solder resist layer structure (in particular having a high(er) polyimide content). In an embodiment, the flexible layer structure is free of a solder resist layer structure. The bending effect may be (significantly) improved/supported by a solder resist layer structure that comprises a flexible material. In an embodiment, the flexible layer structure is only (exclusively) arranged at the flexible portion or in the surroundings of said flexible portion.

In an embodiment, compared to standard solder resist material, the flexible ones may have a higher polyimide content. Standard solder resist may be a hybrid material comprising (meth)acrylate and epoxide building blocks. The flexible solder resist may be a hybrid material comprising polyimide and epoxide building blocks (and optionally methacrylate). Further, a fracture strain of a flex solder resist may be larger than that of standard solder resist (for example more than 10%).

In an embodiment, at least one of the central rigid portion, the first rigid portion, the second rigid portion, comprises a rigid solder layer structure adjacent, in particular in direct contact, to the flexible solder resist layer structure. In other words, rigid portions may be (mainly) covered by a rigid solder resist layer structure, while flexible portions may be (mainly) covered by a flexible solder resist layer structure. Thereby, an especially efficient solder resist/mask) may be provided. In the context of this document, the term "mainly" may refer to a ratio larger than 80%. Therefore, at least 80% of the exposed rigid surface portions may be covered by a rigid solder resist layer structure and/or at least 80% of the exposed flexible surface portions may be covered by a flexible solder resist layer structure.

In an embodiment, the solder resist layer structure monolithically extends on at least one of the rigid portion and at least one of the flexible portion (in other words, the rigidity or the flexibility of the solder resist layer is imparted by the lower layers). This may enable a straightforward implementation.

In an embodiment, the first opening and/or the second opening comprises a metal residue at the bottom/top part, in particular at the sidewalls at the bottom/top part. In an embodiment, the metal residue forms part of a metal layer structure of the stack. In an embodiment the metal residue reflects a manufacture step, in particular routing.

When the opening is formed by drilling through the stack, a hole or passage may go through an electrically conductive layer structure (metal layer structure) within the stack (compare FIG. 5). Depending on the drilling technology, residues of said metal layer structure may remain in the opening, for example at the (sidewall of the) bottom of the opening. Thereby, a step-like structure may be formed in the opening that gives information about the manufacturing process.

In an embodiment, the component carrier is semi-flexible. In an embodiment, the component carrier is fully flexible. In an embodiment, the component carrier is bendable to an S-shape, a Z-Shape, an L-shape, a U-shape, etc. In an embodiment, the first flexible layer structure and/or the second flexible layer structure extends through the whole central rigid portion, the whole first/second flexible portion, and the whole first/second rigid portion (planar extension).

In an embodiment, the method, further comprises: i) forming a first opening in the stack to provide the first flexible portion, and ii) forming a second opening in the stack to provide the second flexible portion, in particular wherein the first opening and the second opening open into different, in particular opposite, directions (+Z, −Z) or the same direction. In this manner, a component carrier layer stack may be used as a starting material to manufacture a component carrier with at least two bending functionalities in a cost-efficient and straightforward manner.

In an embodiment, the first opening and the second opening open into the same direction, e.g., forming a U-shape.

In an embodiment, forming the first opening and/or forming the second opening comprises at least one of drilling, in particular mechanical or laser drilling, routing, etching. This may provide the advantage that established processes can be directly applied within the same component carrier manufacture.

In an embodiment, the component carrier comprises two semi-flexible areas, so that an S-shape can be formed, where the rigid portions are oriented parallel to each other.

In an embodiment, one of the flexible portions is arranged/attached to a main surface of the central rigid portion, while the other flexible portions is arranged to a sidewall of the central rigid portion (see e.g., FIG. 11). This innovative design may enable specific installation procedures or applications.

In an embodiment, at least two of the central rigid portion, the first rigid portion, the second rigid portion, have a different geometry (in particular when seen in top view; along the Z-axis). For example, the length and/or width may be different. For example, the central rigid portion may have a larger length/width than the first rigid portion and/or the second rigid portion.

In an embodiment, the first flexible portion and/or the second flexible portion is in direct contact with the entire (or only a part of) sidewall length of at least one of the central rigid portion, the first rigid portion, the second rigid portion (in particular when seen in a top plan view). This may bring the advantage of having a big design flexibility, while at the same time a reliable connection between the central rigid portion via the first flexible portion to the first rigid portion and/or via the second flexible portion to the second rigid portion is ensured.

In an embodiment, the first flexible portion and the second flexible portion have different geometries (especially when seen in a top view). For example, length/width may be different. Further, at least one of the first flexible portion and the second flexible portion may comprise a specific geometric shape (especially when seen in a top view), for example one of a rectangular shape, a square-shape, a trapezoid-like shape, a cone-like shape, a frustoconical-shape. This may bring the advantage of having an increased design flexibility, while at the same time a reliable connection between the central rigid portion via the first flexible portion to the first rigid portion and/or via the second flexible portion to the second rigid portion is ensured.

In an embodiment, the component carrier is shaped as a plate. This contributes to the compact design, wherein the component carrier nevertheless provides a large basis for mounting components thereon. Furthermore, in particular a bare die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

In the context of the present application, the term "inorganic layer structure" may particularly denote a layer structure which comprises inorganic material, such as an inorganic compound. In particular, dielectric material of the inorganic layer structure or even the entire inorganic layer structure may be made exclusively or at least substantially exclusively from inorganic material. In another embodiment, the inorganic layer structure may comprise inorganic dielectric material and additionally another dielectric material. An inorganic compound may be a chemical compound that lacks carbon-hydrogen bonds or a chemical compound that is not an organic compound. In an example, the inorganic layer structure may comprise glass, for example silicon base glass, in particular soda lime glass, and/or boro-silicate glass and/or alumo-silicate glass and/or lithium silicate glass and/or alkaline free glass. In another example, the inorganic layer structure may comprise ceramic material, for example aluminum nitride and/or aluminum oxide and/or silicon nitride and/or boron nitride and/or tungsten comprising ceramic material. Yet, in another example, the inorganic layer structure may comprise semi-conducting material, for example silicon and/or germanium and/or silicon oxide and/or germanium oxide and/or silicon carbide and/or gallium nitride. In a further embodiment, the inorganic layer structure may comprise (elemental) metal and/or metal alloys, for example, copper and/or tin and/or bronze. Yet in another embodiment, the inorganic layer structure may comprise inorganic material, which is not listed in the above-mentioned example, such as: $MoS_2$, $CuGaO_2$, $AgAlO_2$, $LiGaTe_2$, $AgInSe_2$, $CuFeS_2$, BeO.

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure (and/or the curable dielectric elements) comprises at least one of the group consisting of a resin or a polymer, such as epoxy resin, cyanate ester resin, benzocyclobutene resin, bismaleimide-triazine resin, polyphenylene derivate (e.g. based on polyphenylenether, PPE), polyimide (PI), polyamide (PA), liquid crystal polymer (LCP), polytetrafluoroethylene (PTFE), polyvinylidene fluoride (PVDF) and/or a combination thereof. Reinforcing structures such as webs, fibers, spheres, or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties e.g. FR4 or FR5, which describe their flame-retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten, carbon, platinum, (doped) silicon, and magnesium. Although copper is usually preferred, other materials or coated versions thereof are possible as well, in particular materials coated with supra-conductive material or conductive polymers, such as graphene or poly(3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer, or a further component carrier, for example in a board-in-board configuration. The component may be surface mounted on the component carrier and/or may be embedded in an interior thereof. Moreover, other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected to one another by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular structures comprising or consisting of copper) on a surface of a component carrier. If such exposed electrically conductive layer structures are left unprotected, then the exposed electrically conductive component carrier material (in particular copper) might oxidize, making the component carrier less reliable.

A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

BRIEF DESCRIPTION OF THE DRAWINGS

The aspects defined above, and further aspects of the disclosure are apparent from the examples of embodiment to be described hereinafter and are explained with reference to these example embodiments.

DETAILED DESCRIPTION OF ILLUSTRATED EMBODIMENTS

Figures 1, 2, 3:
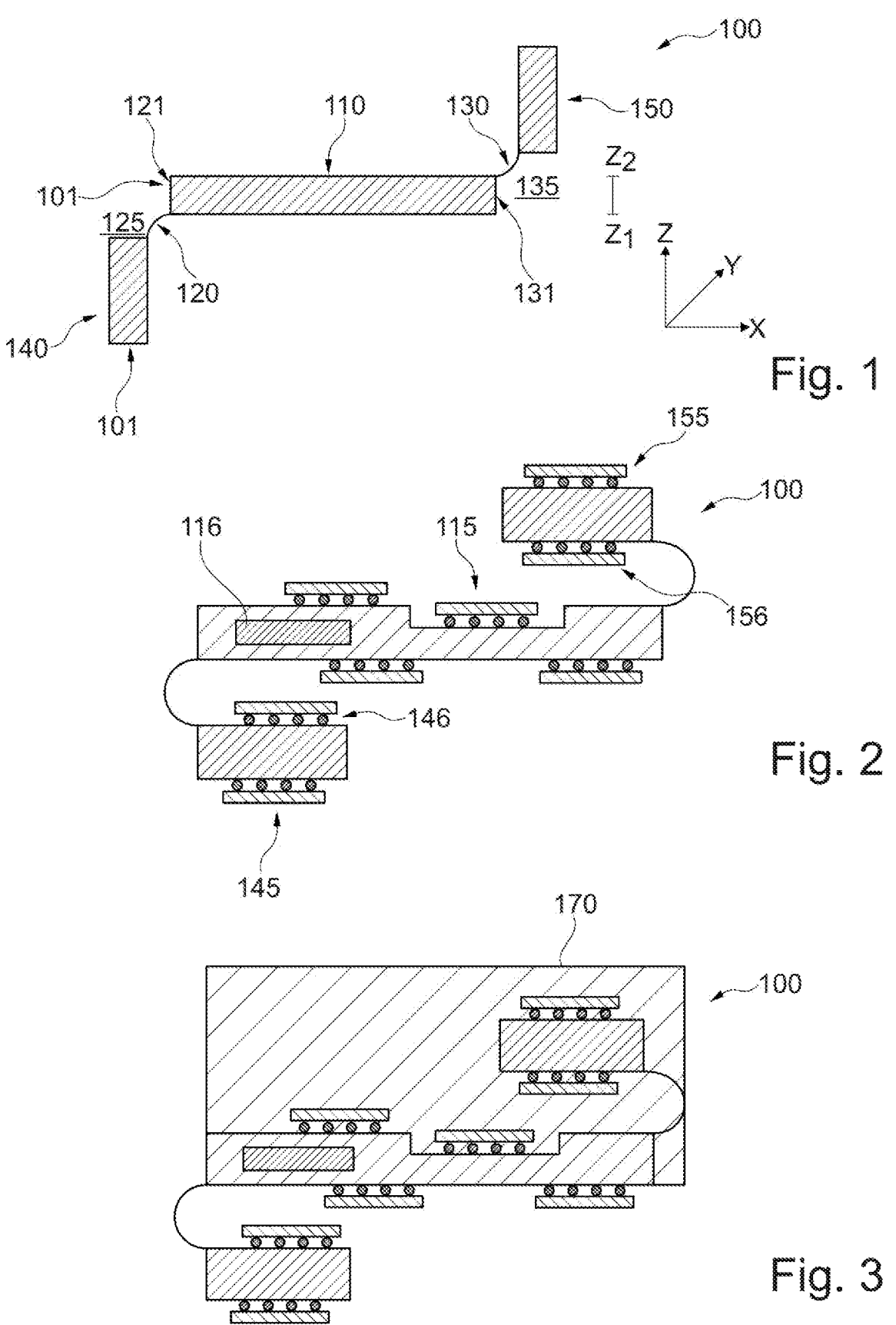
FIG. 1 shows a side-view of a component carrier, according to an exemplary embodiment of the disclosure.
FIG. 2 shows a side-view of a component carrier with a plurality of components, according to an exemplary embodiment of the disclosure.
FIG. 3 shows a side-view of a component carrier with a common encapsulant, according to an exemplary embodiment of the disclosure.

The illustrations in the drawings are schematically presented. In different drawings, similar or identical elements are provided with the same reference signs.

FIG. 1 shows a side-view of a component carrier 100, according to an exemplary embodiment of the disclosure. The component carrier 100 has a stack 101 comprising at least one electrically insulating layer structure 102 (e.g., organic polymer material, in particular (epoxy) resin) and/or at least one electrically conductive layer structure 104 (e.g., metal) (not shown in FIG. 1, see for example the detailed embodiment of FIG. 7).

Additionally or alternatively, the electrically insulating layer structure 102 may comprise an inorganic layer structure, wherein the inorganic layer structure consists or comprises glass material, ceramic material or other inorganic electrically insulating material, e.g., silicon carbide. In an example, the electrically conductive layer structure 104 may comprise copper, silver, gold, titanium, nickel, chromium or tungsten. Additionally or alternatively, the electrically conductive layer structure may comprise non-metallic material, e.g. material comprising or consisting of carbon such as graphene or poly(3,4-ethylenedioxythiophene) (PEDOT).

The component carrier 100 comprises a central rigid portion 110 with a top main surface and an opposed bottom main surface (both oriented along the x-y plane). Further, the central rigid portion 110 comprises a first side 121 (lateral sidewall) and an opposed second side 131 (lateral sidewall) (oriented along the z direction).

In a specific example, the minimum rigid (portion) size may be $5 \times 5$ mm$^2$, $15 \times 15$ mm$^2$ or larger (rectangular, square, round, etc.).

A first flexible portion 120 extends from the first side 121 of the central rigid portion 110 and a second flexible portion 130 extends from a second side 131 of the central rigid portion 110. Hereby, the first flexible portion 120 extends from a first vertical level Z1 from the central rigid portion 110 that is different from a second vertical level Z2 from which the second flexible portion 130 extends from said central rigid portion 110. The vertical level in this context is the position along the thickness direction Z of the stack 101. The first flexible portion 120 and the second flexible portion 130 are opposed to each other with respect to the central rigid portion 110 in the horizontal direction perpendicular to the stacking direction. The first flexible portion 120 is arranged at the bottom (-most) layer of the stack 101, while the second flexible portion 130 is arranged at the top layer of the stack 101. Alternatively, the first and second flexible portions 125, 135 extend from inner or non-exposed layers, which are not in different levels.

In the example of FIG. 1, the flexible portions 120, 130 are respectively bent, wherein the first flexible portion 120 is the bottom outermost layer and is bent to the bottom main surface of the central rigid portion 110, while the second flexible portion 130 is the top outermost layer and is bent to the top main surface of the central rigid portion 110. Thus, the first flexible portion 120 and the second flexible portion 130 are bendable in opposite directions.

Furthermore, at least one flexible portion 120, 130 may be bent to a spatial direction being different from the stack thickness direction, for example in the X-Y plane. Alternatively, the flexible portions 120, 130 may be deformed by shearing and or twisting. Further, bending may not include small radii (otherwise the electrical connection may break).

The component carrier 100 further comprises a first rigid portion 140 (also forming part of the stack 101, e.g., having the same series of layers as the central rigid portion 110) extending from the first flexible portion 120), and a second rigid portion 150 (also forming part of the stack 101), extending from the second flexible portion 130. A first opening 125 opens towards the top of the stack 101 and delimits (defines) the first flexible portion 120, and a second opening 135 opens towards the bottom of the stack 101 and delimits/defines the second flexible portion 130. Alternatively, the layer count (thickness) of the first and/or second rigid portion 140, 150 does not have to be the same as for the central rigid portion 110.

The first rigid portion 140 is bendable, by the first flexible portion 120 (the first rigid portion 140 is rigid but is connected to the first flexible portion 120, so that the first rigid portion 140 is bend together with the first flexible portion 120), with respect to the bottom main surface of the central rigid portion 110, while the second rigid portion 150 is bendable, by the second flexible portion 130 (the second rigid portion 150 is rigid but is connected to the second flexible portion 130, so that the second rigid portion 150 is bent together with the second flexible portion 130), with respect to the top main surface of the central rigid portion 110. In FIG. 1, a bending angle of 90° is illustrated between central rigid portion 110 and first rigid portion 140, and between central rigid portion 110 and second rigid portion 150, respectively.

The stack 101 comprises a first layer structure that extends from the central rigid portion 110 via the first flexible portion 120 into the first rigid portion 140, and a second layer structure that extends from the central rigid portion 110 via the second flexible portion 130 into the second rigid portion 150.

FIG. 2 shows a side-view of a component carrier 100 with a plurality of components, according to an exemplary embodiment of the disclosure.

The central rigid portion 110 comprises a component 115 at least partially embedded in a cavity, wherein the component 115 is still exposed. Further, the central rigid portion 110 comprises a component 116 embedded (fully encapsulated) in the stack 101. Additional surface-mounted components are illustrated.

The first rigid portion 140 comprises a component 145 on a top main surface and a component 146 on an opposed bottom main surface. The second rigid portion 150 comprises a component 155 on a top main surface and a component 156 on an opposed bottom main surface. Additionally or alternatively, a further/other component may be at least partially embedded in the first rigid portion 140 and/or the second rigid portion 150. In FIG. 2, a bending angle of 180° is illustrated between central rigid portion 110 and first rigid portion 140, and between central rigid portion 110 and second rigid portion 150, respectively. Such a bending can enable a coupling (e.g. wireless communication) between the component 115, 116 of the central rigid portion 110 and the further component 145, 146 of the first rigid portion 140 and/or the further component 155, 156 of the second rigid portion 150.

FIG. 3 shows a side-view of a component carrier 100 with a common encapsulant 170, according to an exemplary embodiment of the disclosure. Hereby, the central rigid portion 110, the second flexible portion 130, and the second rigid portion 150 are at least partially embedded in the common encapsulant 170. The common encapsulant fixes a bending angle of 180° in this example. The first flexible portion 120 and the first rigid portion 140 are free of the common encapsulant and the first flexible portion 120 is still bendable.

Figures 4, 5, 6, 7:
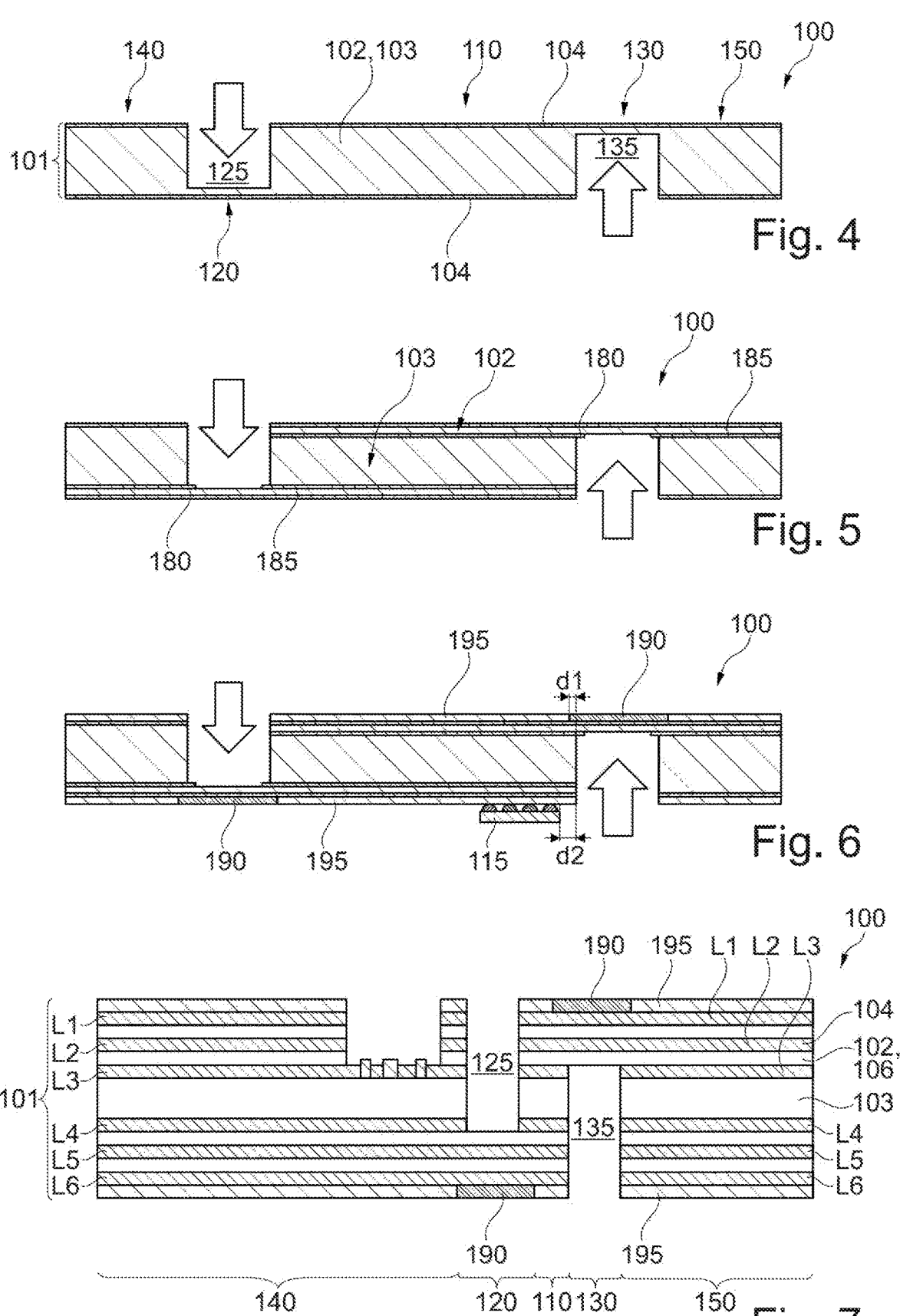
FIG. 4 shows forming openings in a stack to provide the component carrier, according to an exemplary embodiment of the disclosure.
FIG. 5 shows forming openings in a stack to provide the component carrier, thereby forming metal residues in the opening, according to an exemplary embodiment of the disclosure.
FIG. 6 shows forming a component carrier with a flexible solder resist, according to an exemplary embodiment of the disclosure.
FIG. 7 shows a detailed side view of a component carrier stack, according to an exemplary embodiment of the disclosure.

FIG. 4 shows forming openings 125, 135 in a stack 101 to provide the component carrier 100, according to an exemplary embodiment of the disclosure. In a first step (not shown), the stack 101 is provided with an electrically insulating layer structure 102 (e.g. a prepreg or a fully cured core layer 103) sandwiched between two electrically conductive layer structures 104 (e.g., a copper-clad laminate). A first opening 125 is formed by drilling from the top main surface of the stack 101. The bottom of the drilled hole 125 now represents the first flexible portion 120 which connects in a bendable manner the central rigid portion 110 of the stack 101 and the first rigid portion 140 of the stack 101. Further, a second opening 135 is formed by drilling from the bottom main surface of the stack 101. The top of the second drilled hole 135 now represents the second flexible portion 130 which connects in a bendable manner the central rigid portion 110 of the stack 101 and the second rigid portion 150 of the stack 101.

FIG. 5 shows forming openings 125, 135 in a stack 101 to provide the component carrier 100, thereby forming metal residues 180 in the openings 125, 135, according to an exemplary embodiment of the disclosure. The example of FIG. 5 is comparable to the one of FIG. 4 with the difference being that the stack 101 of FIG. 5 comprises two additional electrically conductive layer structures (metal layer structures) 185. The stack 101 of FIG. 5 comprises a core layer structure 103 sandwiched by the metal layer structures 185, which are further sandwiched by respective electrically insulating layer structures 102, and respective electrically conductive layer structures 104.

The further electrically insulating layer structure 102 may comprise the material as the core layer structure 103, e.g., (epoxy) resin or polyimide. Alternatively, the further electrically insulating layer structure 102 may comprise different material than the core material 103. Core material may be epoxy resin, whereas the further electrically insulating layer structure 102 may be made of polyimide or polyamide or polyethylene terephthalate.

The holes are drilled from top/bottom down to the respective metal layer structure 185 and through said structures 185 to expose the electrically insulating layer structure 102 below. As can be seen in FIG. 5, such a drilling process (e.g. routing) can lead to respective metal residues 180 in the first opening 125 and/or the second opening 135. The metal residues 180 (being part of the metal layer structure 185) can be arranged at the bottom part, in particular at the sidewalls at the bottom part, of the respective opening, thereby forming a step-like structure.

FIG. 6 shows forming a component carrier 100 with a flexible solder resist 190, according to an exemplary embodiment of the disclosure. The component carrier 100 is formed in a similar manner as described for FIG. 5. Additionally, solder resist layer structures 190, 195 have been applied to the top main surface and the bottom main surface of the stack 101. At the rigid portions 110, 140, 150, a conventional (rigid) solder resist 195 has been applied. Yet, at the flexible portions 120, 130, a flexible layer structure with a flexible solder resist layer structure 190 has been provided. The rigid solder layer structure 195 is adjacent (here in direct contact) to the flexible solder resist layer structure 190. Alternatively, they may not be in contact, especially after bending.

The extension of the flexible solder resist layer structure 190 in the horizontal direction (perpendicular to the stacking direction) is (slightly) larger than the diameter of the respective opening 125, 135 of the flexible portions 120, 130. Such an overlap (extending from the sidewall of the opening) d1 of the flexible solder resist layer structure 190 can be for example in the range 100 to 500 μm, in particular around 300 μm. The rigid solder resist 195 and the flexible solder resist 190 may comprise at least one different material property, for example, the flexible solder resist 190 may comprise (a higher amount of) polyimide.

Further, a component 115 is placed on the solder resist layer structure 195 at the bottom main surface of the stack 101 next to the opening. A distance d2 between component 115 and opening can be around 300 μm, for example in the range 100 to 500 μm. A height of the electrically conductive layer structures 104, 185 is preferably 50 μm or lower. In an example, d1 may be larger than d2. Additionally or alternatively, d1 may be smaller than d2.

FIG. 7 shows a detailed side view of a component carrier 100, according to an exemplary embodiment of the disclosure. The stack 101 comprises a central core layer (FR4 core) 103 and a symmetric layer build-up, comprising alternating layers of electrically conductive layer structures (copper) 104 and electrically insulating layer structures (prepreg) 102. Further, a solder resist layer structure 195 is provided on the top and the bottom main surface of the stack 101. Additionally, a surface finish (here ENIG) can be applied.

Like in the examples of FIGS. 4 to 6, a first opening 125 and a second opening 135 have been formed/drilled in the stack 101, thereby providing the first flexible portion 120 and the second flexible portion 130.

Figure 8:
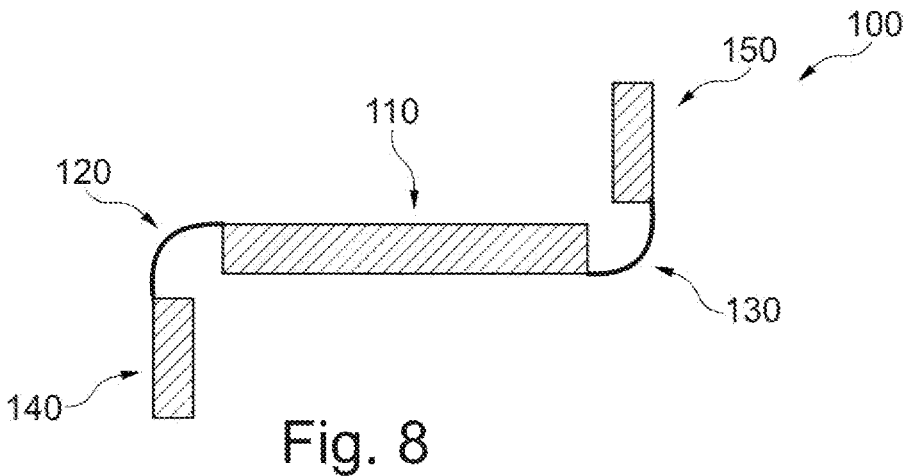
FIG. 8 shows a side-view of a component carrier, according to a further exemplary embodiment of the disclosure.

FIG. 8 shows a side-view of a component carrier 100, according to a further exemplary embodiment of the disclosure. This embodiment is comparable to the one of FIG. 1, with the difference being that the flexible bending portions 120, 130 are arranged at the outside of the respective bending region.

In other words, the first flexible portion 120 is arranged at the top (top outermost layer) of the stack 101, while the second flexible portion 130 is arranged at the bottom (bottom outermost layer) of the stack 101. The benefit can be that the reliability is ensured, since a crack/break may be reduced/avoided.

Figure 9:
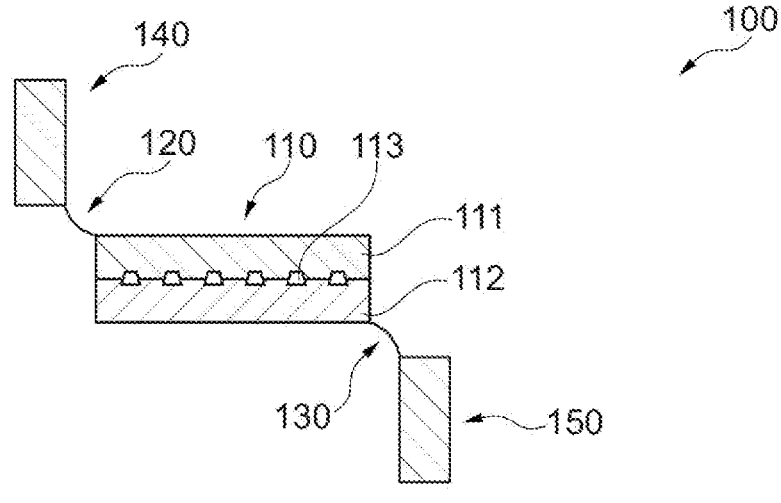
FIG. 9 shows a side-view of a component carrier with a multi-layer central rigid portion, according to a further exemplary embodiment of the disclosure.

FIG. 9 shows a side-view of a component carrier 100 with a multi-layer central rigid portion 110, according to a further exemplary embodiment of the disclosure. It can be seen that the central rigid portion 110 comprises two layers 111, 112, which are connected by a Z-interconnection 113. In this example, the first rigid portion 140 comprises the material of the first layer 111, while the second rigid portion 150 comprises the material of the second layer 112.

In an example, the first rigid portion 140 may extend via the first flexible portion 120 to the central rigid portion 110 comprising the first layer 111 and the second rigid portion 150 may extend via the second flexible portion 130 to the central rigid portion 110 comprising the first layer 111. Alternatively, the first rigid portion 140 may extend via the first flexible portion 120 to the central rigid portion 110 comprising the second layer 112 and the second rigid portion 150 may extend via the second flexible portion 130 to the central rigid portion 110 comprising the second layer 112.

Figure 10:
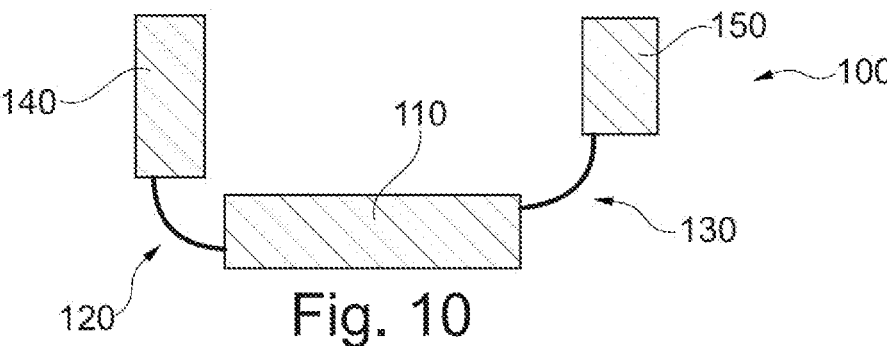
FIG. 10 shows a side-view of a component carrier forming a U-shape, according to a further exemplary embodiment of the disclosure.

FIG. 10 shows a side-view of a component carrier 100 forming a U-shape, according to a further exemplary embodiment of the disclosure. While the first flexible portion 120 and the second flexible portion 130 are bend in different directions in the other Figures, FIG. 10 shows an example, wherein the first flexible portion 120 and the second flexible portion 130 (and accordingly the first rigid portion 140 and the second rigid portion 150 as well) are bend in the same direction. Here, both flexible portions 120, 130 are bent around 90°, thereby forming a U-shape. It can be further seen that the flexible portions 120, 130 are arranged at different vertical heights of the central rigid portion 110, yet, none of the flexible portions 120, 130 is configured as the respective outermost layer.

Figure 11:
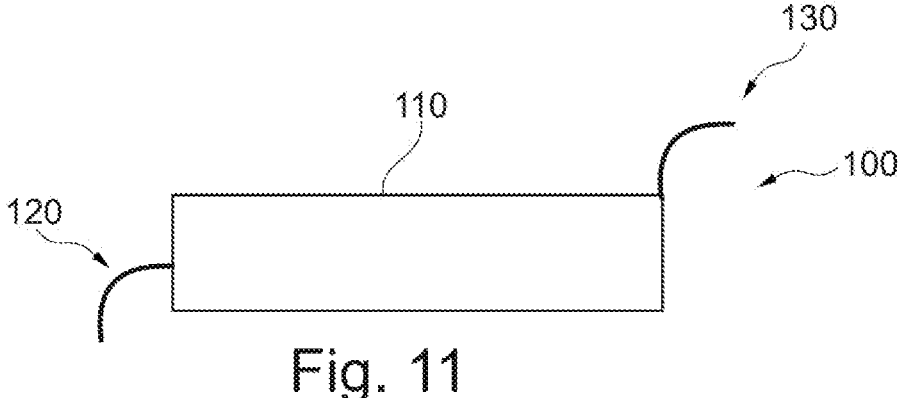
FIG. 11 shows a side-view of a component carrier with a flexible portion at a main surface, according to a further exemplary embodiment of the disclosure.

FIG. 11 shows a side-view of a component carrier 100 with the second flexible portion 130 connected to the central rigid portion 110, so that it extends in the stack thickness direction (along the Z-axis), according to a further exemplary embodiment of the disclosure. In other words, the second flexible portion 130 is arranged/attached at an edge between main surface and a sidewall of the central rigid portion 110. The first flexible portion 120 is arranged at the sidewall of the central rigid portion 110 (like in the other Figures).

Figure 12:
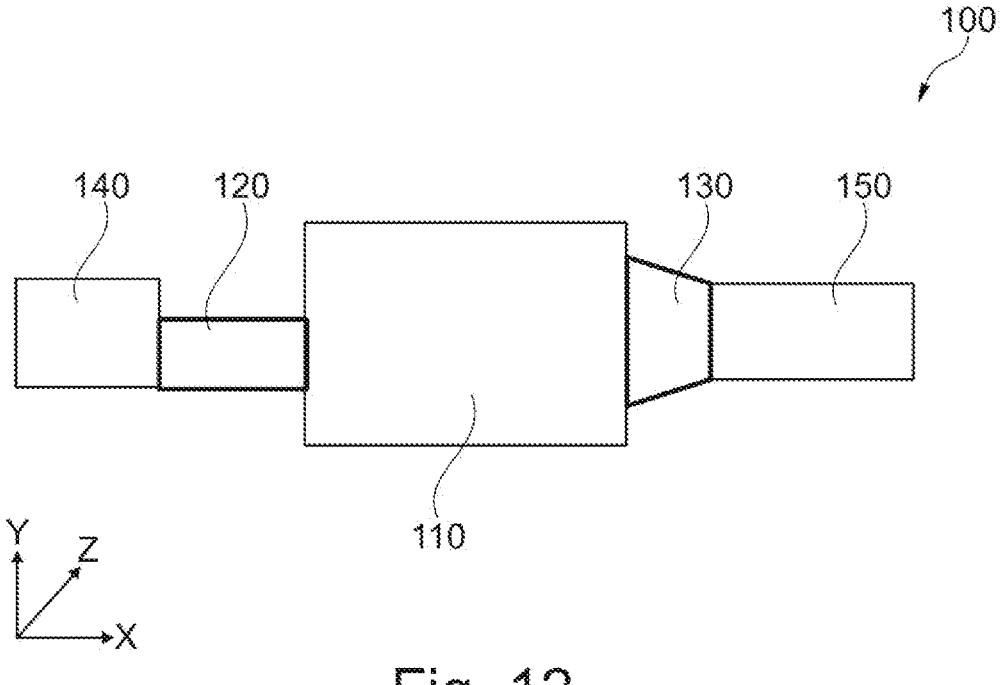
FIG. 12 shows a top-view on a component carrier according to a further exemplary embodiment of the disclosure.

FIG. 12 shows a top-view on a component carrier 100 according to a further exemplary embodiment of the disclosure. In this view, in this example, the central rigid portion 110, the first rigid portion 140, and the second rigid portion 150 have different geometries, for example different length and/or width. The second flexible portion 130 is in direction contact with the entire sidewall length of the second rigid portion 150 and the first flexible portion 120 is in direct contact only with a part of the sidewall length of the first rigid portion 140. Furthermore, in this example, the first flexible portion 120 comprises a rectangular shape, while the second flexible portion 130 comprises a trapezoid-like shape.

It should be noted that the term "comprising" does not exclude other elements or steps and the article "a" or "an" does not exclude a plurality. Also, elements described in association with different embodiments may be combined.

Implementation of the disclosure is not limited to the preferred embodiments shown in the figures described above. Instead, a multiplicity of variants are possible which variants use the solutions shown and the principle according to the disclosure even in the case of fundamentally different embodiments.

REFERENCE SIGNS

100 Component carrier
101 Stack
102 Electrically insulating layer structure
103 Core layer
104 Electrically conductive layer structure
110 Central rigid portion
111 First layer central rigid portion
112 Second layer central rigid portion
113 Z-Interconnection
115 Component in cavity
116 Component embedded
120 First flexible portion
121 First side
125 First opening
130 Second flexible portion 131 Second side
135 Second opening
140 First rigid portion
145 First further component, top
146 First further component, bottom
150 Second rigid portion
155 First further component, top
156 First further component, bottom
170 Encapsulation, mold
180 Metal residue
185 Metal layer structure
190 Flexible solder resist layer structure
195 Solder resist layer structure

The invention claimed is:

1. A component carrier having a stack comprising at least one electrically insulating layer structure and/or at least one electrically conductive layer structure, the stack comprising:
   a central rigid portion;
   a first flexible portion, extending from a first side of the central rigid portion; and
   a second flexible portion, extending from a second side of the central rigid portion;
   wherein the first flexible portion extends from a first vertical level from the central rigid portion that is different from a second vertical level from which the second flexible portion extends from the central rigid portion;
   wherein the first flexible portion and/or the second flexible portion comprises at least one flexible layer structure, and
   wherein the flexible layer structure comprises a flexible solder resist layer structure.

2. The component carrier according to claim 1,
   wherein the central rigid portion comprises at least two opposed main surfaces,
   wherein the first flexible portion extends to a first of the main surfaces, and
   wherein the second flexible portion extends to a second of the main surfaces or wherein the second flexible portion extends to the first of the main surfaces.

3. The component carrier according to claim 1,
   wherein the first flexible portion and the second flexible portion are opposed to each other with respect to the central rigid portion in a direction perpendicular to the stacking direction.

4. The component carrier according to claim 1,
   wherein the first flexible portion and the second flexible portion are bendable in different directions.

5. The component carrier according to claim 1,
   wherein the first flexible portion is arranged at a bottom or top part of the stack; and/or
   wherein the second flexible portion is arranged at a top or bottom part of the stack.

6. The component carrier according to claim 1,
   wherein a first opening opens to the top or bottom of the stack at least partially delimiting the first flexible portion; and/or
   wherein a second opening opens to the bottom or top of the stack at least partially delimiting the second flexible portion.

7. The component carrier according to claim 1, further comprising:
   a first rigid portion extending from the first flexible portion; and/or
   a second rigid portion extending from the second flexible portion.

8. The component carrier according to claim 7, configured such that the first rigid portion is bendable, by the first flexible portion, with respect to the first main surface of the central rigid portion; and/or the second rigid portion is bendable, by the second flexible portion, with respect to the second main surface of the central rigid portion.

9. The component carrier according to claim 1, wherein at least one of the central rigid portion, the first rigid portion, the second rigid portion, the first flexible portion, the second flexible portion, is configured to reach a bending angle of the first flexible portion and/or the second flexible portion with respect to the respective central rigid portion and/or the first rigid portion and/or the second rigid portion of at least 450.

10. The component carrier according to claim 1, wherein at least one of the central rigid portion, the first rigid portion, the second rigid portion, the first flexible portion, the second flexible portion, is configured to bend the first flexible portion and the second flexible portion toward opposed directions.

11. The component carrier according to claim 1, wherein the stack comprises a first layer structure that extends from the central rigid portion to the first flexible portion; and/or wherein the stack comprises a second layer structure that extends from the central rigid portion to the second flexible portion.

12. The component carrier according to claim 1, wherein the central rigid portion comprises at least one of a component embedded in a cavity, an embedded component, a surface-mounted component.

13. The component carrier according to claim 1, wherein the first rigid portion and/or the second rigid portion comprises at least one of a component embedded in a cavity, an embedded component, a surface-mounted component.

14. The component carrier according to claim 1, wherein the central rigid portion and the first flexible portion are embedded in a common encapsulant; or wherein the central rigid portion and the second flexible portion are embedded in a further common encapsulant.

15. The component carrier according to claim 1, wherein the first opening and/or the second opening comprises a metal residue at the bottom part, the metal residue being part of a metal layer structure of the stack.

16. The component carrier according to claim 1, wherein the component carrier is semi-flexible; and/or wherein the component carrier is bendable to an S-shape.

17. A method of manufacturing a component carrier, the method comprising:

providing a stack comprising at least one electrically insulating layer structure and/or at least one electrically conductive layer structure, and a central rigid portion;

forming a first flexible portion, extending from a first side of the central rigid portion; and forming a second flexible portion, extending from a second side of the central rigid portion;

wherein the first flexible portion extends from a first vertical level from the central rigid portion that is different from a second vertical level from which the second flexible portion extends from the central rigid portion;

wherein the first flexible portion and/or the second flexible portion comprises at least one flexible layer structure, and wherein the flexible layer structure comprises a flexible solder resist layer structure.

18. The method according to claim 17, further comprising:

forming a first opening in the stack to provide the first flexible portion; and forming a second opening in the stack to provide the second flexible portion;

wherein the first opening and the second opening open into different directions.

\* \* \* \* \*